United States Patent [19]
Brehmer

[11] Patent Number: 5,844,442
[45] Date of Patent: Dec. 1, 1998

[54] LOW VOLTAGE FULLY DIFFERENTIAL OPERATIONAL AMPLIFIER WITH IMPROVED COMMON MODE CIRCUITRY

[75] Inventor: Geoffrey E. Brehmer, Austin, Tex.

[73] Assignee: Advanced Micro Devices, Inc.

[21] Appl. No.: 916,135

[22] Filed: Aug. 21, 1997

Related U.S. Application Data

[63] Continuation of Ser. No. 770,680, Dec. 17, 1996, abandoned, which is a continuation of Ser. No. 667,904, Jun. 20, 1996, abandoned, which is a continuation of Ser. No. 558,046, Nov. 13, 1995, abandoned, which is a continuation of Ser. No. 424,608, Apr. 17, 1995, abandoned, which is a continuation of Ser. No. 109,323, Aug. 19, 1993, abandoned.

[51] Int. Cl.[6] ..................................................... H03F 3/45
[52] U.S. Cl. ............................................. 330/258; 330/261
[58] Field of Search ................................... 330/253, 258, 330/261; 307/497, 568

[56] References Cited

U.S. PATENT DOCUMENTS

| | | |
|---|---|---|
| 5,006,817 | 4/1991 | Babenezhad . |
| 5,015,966 | 5/1991 | McIntyre ................................. 330/253 |
| 5,117,199 | 5/1992 | Wang et al. . |
| 5,166,635 | 11/1992 | Shih . |
| 5,216,380 | 6/1993 | Carbou ................................... 330/258 |

FOREIGN PATENT DOCUMENTS

| | | |
|---|---|---|
| 0 028 932 | 11/1980 | European Pat. Off. . |
| 0 493 335 | 12/1991 | European Pat. Off. . |
| 0126811 | 5/1989 | Japan ..................................... 330/258 |

OTHER PUBLICATIONS

Klaas Bult and Govert J. G. M. Geelen, "A Fast–Settling CMOS Op Amp For SC Circuits With 90–dB DC Gain", IEEE Journal of Solid–State Circuits, vol. 25, No. 6, Dec. 1990, pp. 1379 through 1384.

Andre Abrial, Jacky Bouvier, Jean–Michel Fournier, Patrice Senn and Michel Veillard, "A 27–MHz Digital–To–Analog Video Processor", IEEE Journal of Solid–State Circuits, vol. 23, No. 6, Dec. 1988, pp. 1358 through 1369.

J. F. Duque–Carrillo et al. "A Family of Bias Circuits for High Input Swing CMOS Operational Amplifiers", 1992 IEEE International Symposium on Circuits and Systems, May 10, 1992, vol. 6, pp. 3021–3024.

Hidetoshi Onodera et al. "Analog Circuit Placement—Branch—and—Bound Placement with Shape Optimization–", Proceedings of the IEEE 1992 Custom Integrated Circuits Conference, May 3, 1992, Boston, US, pp. 11.5.1–11.5.6.

P. J. Crawley et al. "Designing Operational Transconductance Amplifiers For Low Voltage Operation," 1993 IEEE International Symposium on Circuits and Systems, May 3, 1993, Chicago, US, vol. 2, pp. 1455–1458.

N. Van Bavel et al. "ISDN U Transceiver Analog Frong–End," Proceedings of the IEEE 1990 Custom Integrated Circuits Conference, May 13, 1990, Boston, US, pp. 12.1.1–12.1.5.

*Primary Examiner*—William L. Sikes
*Assistant Examiner*—Tiep H. Nguyen

[57] ABSTRACT

A fully differential operational amplifier with improved common mode circuitry for low supply voltage applications is disclosed. The amplifier includes inventing and non-inventing inputs and dual-ended invented and non-invented outputs. The amplifier also includes source transistors for pulling the output to obtain particular output voltage swing. Connections between the inputs and outputs include DC biasing circuitry. The amplifier includes a transistor of select size and characteristics to compensate for voltage drop due to other transistors of the amplifier. Common mode circuitry of the amplifier provides a high level of common mode reconstruction.

25 Claims, 6 Drawing Sheets

LOW VOLTAGE FULLY DIFFERENTIAL OPERATIONAL AMPLIFIER WITH IMPROVED COMMON MODE CIRCUITRY

This is a continuation of application Ser. No. 08/770,680, filed Dec. 17, 1996, which is a continuation of application Ser. No. 08/667,904, filed Jun. 20, 1996, which is a continuation of application Ser. No. 08/558,046, filed Nov. 13, 1995, which is a continuation of application Ser. No. 08/424,608, filed Apr. 17, 1995, which is a continuation of application Ser. No. 08/109,323, filed Aug. 19, 1993 all are now abandoned.

BACKGROUND OF THE INVENTION

1. Field of the Invention

The invention relates to fully differential amplifiers for use as operational amplifiers, and more particularly, to a fully differential operational amplifier for low power supply operation, having a unique DC biasing scheme and incorporating a new common mode reconstruction technique.

2. Background of the Invention

Fully differential amplifiers are common components of electronic devices. A fully differential amplifier is an amplifier with two inputs and two outputs. The outputs are amplified versions of the inputs. These amplifiers serve to amplify the two input signals to the amplifier, yielding dual amplified outputs.

Fully differential amplifiers are important in many applications where weak signals (for example, in low supply voltage arrangements) may be contaminated by "pickup" and other miscellaneous noise. In the case of many low supply voltage operations, like battery powered or portable communication devices, if a single-ended input (i.e. , a single, individual input signal with an absolute value) is input and used by an amplifier, undesired "pickup" and noise which are input with that signal may be also picked up and amplified along with the desired input signal . In that event, output from the amplifier will vary from desired output depending upon the particular "pickup" or other noise. If, on the other hand, the amplifier is a fully differential amplifier and so has dual inputs and dual outputs, then both inputs to the amplifier pick up the same "pickup" or noise signals at the same time and those "pickups" or noise signals are amplified along with the desired input signals to give the respective outputs. In a difference determination between the two outputs, then, the amplified "pickup"/noise components of the outputs cancel each other and there is no resulting differential amplification effect from or of these undesired signals.

Fully differential amplifiers generally include common mode circuitry. In the typical fully differential amplifier, the common mode circuitry receives a reference analog voltage signal and serves to pull or push the outputs of the fully differential amplifiers as necessary to bring the voltages of the outputs near that of the reference analog voltage signal. The process of pulling or pushing to bring the two output signal voltages near the reference analog voltage is referred to as "common mode reconstruction". Effective common mode reconstruction is a desired attribute of fully differential amplifiers.

In simplistic form and for purposes of a better understanding hereof, a single stage fully differential amplifier may be thought of as consisting of two inputs, two outputs, and some means for common mode reconstruction. Each of the outputs is taken off a transistor collector with respect to ground. The amplifier circuit responds differently to common-mode signals than to non common-mode (or "differential" signals. Common-mode signals drive each of the inputs in phase with equal-amplitude voltages. Differential signals, on the other hand, are applied to either of the inputs, not both, and so drive only the particular input to which the signal is applied. In operation, the fully differential amplifier takes the differential signal inputs and creates differential outputs, the phase and amplitude of each being dictated by the respective input signal and feedback considerations; the amplifier takes the common-mode signal inputs and creates two outputs in respect of those common-mode inputs, which are same-phase and equal-amplitude voltage. Where both differential and common-mode signals are simultaneously input to the two inputs, each output of the fully differential amplifier is dictated by the two components of the respective input, i.e., the common-mode signal component and the differential signal component. In a difference determination between the two outputs of the fully differential amplifier, the components of each output attributable to common-mode signals may be cancelled.

Fully differential amplifiers, like all solid-state amplifiers, require some form of bias. At the minimum, the base-source junction of any solid-state amplifier must be reverse biased. Other biasing may be appropriate to obtain desired operation of the amplifier, such as desired output voltage swing and others. The desired bias, in any event, is produced by applying voltages to the corresponding transistor elements through bias networks. Biasing networks may typically serve a number of purposes, and, in any case of a biasing network, biasing for one purpose may affect other aspects of amplifier circuit operation.

One biasing technique, sometimes referred to as matched base-emitter biasing, can be used to make what is called a current mirror. A current mirror is important in fully differential amplifier devices in a number of instances where a current source is needed. A common arrangement for a current mirror is sometimes referred to as a Wilson mirror. The Wilson mirror is a pair of gm p-channel or n-channel MOSFET devices connected in series. This arrangement has one leg carrying a reference current which is mirrored by the two transistors in series in the other leg. This technique works to sufficiently mirror current in most cases, however, in low power applications, a relatively significant voltage drop occurs across the two transistors in series. That voltage drop takes up a significant amount of the possible output voltage swing of the amplifier, so the actual output voltage swing is often within a narrower range than the range of operating voltage available from the power supply.

In addition to biasing, it is important in fully differential amplifiers to have operational characteristics sufficient to prevent conversion of common-mode signals (i.e., "pickup" or other noise) into difference signals (which produce an output). As previously discussed, fully differential amplifiers operate by producing dual outputs in response to respective dual inputs. Both leads of these amplifiers will pick up the same "pickup" and other miscellaneous noise (i.e., common-mode signals) at the same time, which will appear amplified in the respective outputs. The outputs are then typically subjected to a difference determination in which the "pickup"/noise signals appearing amplified in each of the outputs is cancelled.

Fully differential amplifiers are operational amplifiers. They have all the same characteristics with the exception of having two outputs rather than one. In effect, fully differential operational amplifiers behave by "looking" at a reference voltage and swinging the output terminals around so that the voltages of the outputs draw close to that of the particular amplifier power supply voltage. In an ideal arrangement, the swing of voltage of each of the outputs may be as great as the range of power supply operating voltage. For example, if a power supply yielding a 0 to 5 volt supply voltage range operates a fully differential amplifier, then the voltage of each of the outputs can theoretically swing between 0–5 volts. Likewise, in the case of a power supply yielding a 0 to 2.7 volt supply voltage range for a fully differential amplifier, a 0–2.7 volt swing is theoretically possible for each of the outputs. So these are the ideal cases for a 0–5 supply voltage and a 0–2.7 supply voltage, respectively.

In the real world these ideal conditions cannot be absolutely met. The real world fully differential operational amplifier will be operable around some range at about the mid-voltage of the power supply operating voltage range and the voltage swing of each of the outputs will be around this mid-voltage plus or minus some $\Delta V$, which is something less than the theoretical output voltage possible given the range of supply voltage available from the power supply. In practice, fully differential operational amplifiers typically work best at around a mid voltage of the two outputs, which is considered the common level voltage.

The present invention is a low voltage fully differential operational amplifier having improved common mode circuitry. The amplifier is designed to work with low supply voltages and yet meet the output range performance requirements found in higher voltage applications. The amplifier includes an improved DC biasing scheme and improved common mode circuitry providing more effective common mode reconstruction. These features allow the outputs of the amplifier to swing over a substantially greater range, even in low power supply applications and solve many diverse problems found in the prior technology, for example, problems of gain-band width, output swing, stability, common mode reconstruction, and manufacturability.

SUMMARY OF THE INVENTION

One embodiment of the invention is a fully differential operational amplifier. The amplifier comprises an inverting input, a non-inverting input, a first output, having a first voltage, a second output, having a second voltage, a reference voltage input, having a reference voltage, first circuitry for amplifying, connected to the inverting input and the non-inverting input to yield the first output and the second output, second circuitry for common mode reconstruction, the second circuitry receives the reference voltage input and the first output and the second output and pushes or pulls each of the first output and the second output to draw the first voltage and the second voltage substantially near the reference voltage of the reference voltage input.

In another aspect, the second circuitry for common mode reconstruction comprises circuitry for determining an average of the first voltage and the second voltage, circuitry for pushing the outputs high when the reference voltage exceeds the average and for pulling the outputs low when the average exceeds the reference voltage.

In yet another aspect, the second circuitry for common mode reconstruction includes common mode circuitry.

In a further aspect, the amplifier further comprises at least one cascode circuit connected to the circuitry for pushing and at least one cascode circuit connected to the circuitry for pulling.

In even a further aspect, the second circuitry for common mode reconstruction includes DC biasing circuitry.

In another further aspect, the second circuitry for common mode reconstruction comprises an input of the reference voltage input of about a mid-point of a range of power supply voltage and an input of a difference signal determined as an average of the first voltage and the second voltage, the inputs each being directed to a gate of a p-channel transistor, each of the p-channel transistors being connected to series connected n-channel transistors, each of the n-channel transistors having a common drain, and series connected p-channel transistors connecting between the inputs.

In another aspect, the circuitry for pushing is at least one source transistor and the circuitry for pulling is at least one sink transistor.

In yet another aspect, the DC biasing circuitry establishes bias voltages on the circuitry for pulling, thereby maintaining the circuitry for pulling substantially in saturation.

In even another aspect, the first circuitry for amplifying includes DC biasing circuitry, the DC biasing circuitry including four identically or unit multiply sized n-channel transistors, the n-channel transistors receiving a second bias current input, and three identically or unit multiply sized n-channel sink transistors connected to the n-channel transistors, the n-channel sink transistors receiving the second bias current input, and being connected to a select transistor having desired characteristics to maintain current mirroring, thereby causing the n-channel transistors and the n-channel sink transistors to remain substantially in saturation.

In a further aspect, the DC biasing circuitry establishes bias voltages on the circuitry for pulling, thereby maintaining the circuitry for pulling substantially in saturation.

In yet a further aspect, each of the p-channel transistors are biased by an applied bias voltage and at least one of the series connected n-channel transistors is biased by a different applied bias voltage.

In even a further aspect, the amplifier further comprises DC biasing circuitry, the DC biasing circuitry selectively establishes bias voltages on the circuitry for pulling, thereby maintaining the circuitry for pulling in saturation, and on the circuitry for pushing, thereby maintaining the circuitry for pushing in saturation for substantially the entire range of voltages of the outputs.

In another aspect, the amplifier further comprises at least one cascode circuit connected to the circuitry for pushing and at least one cascode circuit connected to the circuitry for pulling, wherein the DC biasing circuitry also establishes bias voltages on the at least one cascode circuit connected to the circuitry for pushing and on the at least one cascode circuit connected to the circuitry for pulling.

In yet another aspect, the at least one of the series connected n-channel transistors are biased by the bias voltages established by the DC biasing circuitry.

In a further aspect, the second circuitry for common mode reconstruction includes a common mode circuitry.

In yet a further aspect, the other of the n-channel transistors receiving the second bias current input and the select transistor are connected to the at least one of each of the series connected n-channel transistors to maintain current mirroring between each of the n-channel transistors of the DC biasing circuitry and the series connected n-channel transistors of the second circuitry for common mode reconstruction.

In even a further aspect, the common mode circuitry comprises an input of the reference voltage input of about a mid-point of a range of power supply voltage and an input of a common mode output voltage from the amplifier, the inputs each being directed to a gate of a p-channel transistor, each of the p-channel transistors being connected to series connected n-channel transistors, at least two of the n-channel transistors having a common drain, and series connected p-channel transistors connecting between the inputs.

Another embodiment of the invention is the improvement in a method of DC biasing and common mode reconstructing in a fully differential operational amplifier having dual inputs and dual-ended outputs, and further having p-channel source transistors and n-channel sink transistors, wherein the DC biasing includes pushing the output high when a voltage differential between the dual inputs is positive to bring the voltage level of the outputs near a power supply voltage and pulling low when the voltage differential between the dual inputs is negative to bring the voltage level of the outputs near a ground and wherein the common mode reconstructing includes inputting an externally supplied analog ground reference voltage of about a mid-point of a range of power supply voltage and inputting an average of the outputs from the amplifier and substantially mirroring currents of the common mode circuitry in order to reconstruct the outputs to account for voltage errors attributable to common mode signals input to the amplifier via the inputs and due to voltage drop attributable thereto within the amplifier.

Even another embodiment of the invention is a method of common mode reconstruction in a differential operational amplifier having dual inputs and dual-ended outputs, the amplifier comprised of sinking transistors and sourcing transistors and corresponding biasing transistors. The method comprises the steps of inputting an externally supplied analog ground reference voltage of about a mid-point of a range of power supply voltage for the amplifier to a gate of a first p-channel transistor, inputting an average signal being an average of the outputs, from the amplifier to a gate of a second p-channel transistor, connecting each of the first p-channel transistor and the second p-channel transistor to series connected p-channel transistors, and connecting the first p-channel transistor to series connected n-channel transistors, at least two of the n-channel transistors having a common drain, connecting the second p-channel transistor to series connected n-channel transistors, each of the n-channel transistors having a common drain, connecting each of the series connected n-channel transistors to a common ground, and connecting the amplifier at a drain of the p-channel transistor; wherein currents in the amplifier are substantially mirrored via the method, thereby reconstructing the dual-ended outputs to account for voltage errors attributable to common mode signals input to the amplifier via the inputs and due to voltage drop attributable to the amplifier.

In another aspect, the method further comprises the step of connecting the amplifier with DC biasing circuitry.

In yet another aspect, the DC biasing further includes accounting for a voltage differential between dual biasing currents across biasing transistors of the biasing circuitry and yielding substantially identical biasing currents to all of the sinking transistors and substantially identical biasing currents to all of the sourcing transistors and all of the sinking transistors of the amplifier.

In a further aspect, the method further comprises the step of connecting cascode transistors to the sourcing transistors and the sinking transistors.

BRIEF DESCRIPTION OF THE DRAWINGS

For a more complete understanding of the present invention and for further objects and advantages thereof, reference may now be had to the following description in conjunction with the accompanying drawings, in which.

DETAILED DESCRIPTION OF THE INVENTION

Figure 1:
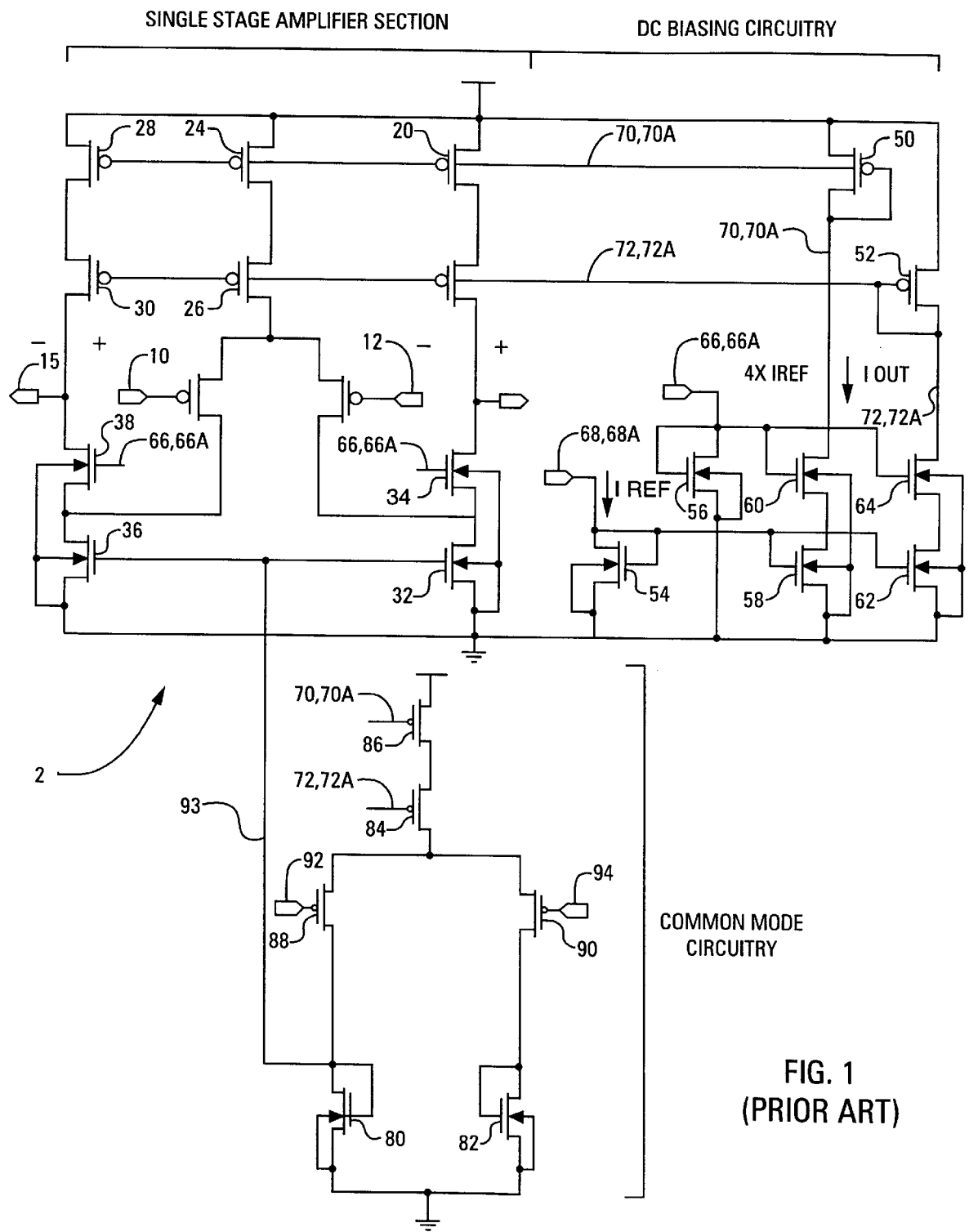
FIG. 1 is a detailed schematic representation of a prior art, single stage fully differential operational amplifier, utilizing classical methods for biasing and current mirroring and for common mode circuitry.

In order to understand the principles and advantages of the present invention, it is helpful to first consider a prior art single stage differential operational amplifier and its operation and characteristics. Referring first to FIG. 1, such a prior art single stage differential amplifier 2 is shown. The amplifier 2 generally includes a single stage amplifier section, a network of DC biasing circuitry, and a common mode reconstruction circuitry stage. Inputs to the single stage amplifier consist of an inverting input 12 and a non-inverting input 10. The amplifier 2 has dual-ended non-inverting and inverting outputs 14, 15, respectively. The amplifier section also includes an arrangement of p-channel transistors 20, 22, 24, 26, 28, 30 and an arrangement of n-channel transistors 32, 34, 36, 38.

Continuing to refer to FIG. 1, the amplifier section includes an input stage and an output stage. The input stage of the amplifier 2 includes the inputs 10, 12, transistors 24, 26, and biasing currents 70, 72 having bias voltages 70a, 72a for those transistors.

The output stage of the amplifier includes outputs 14, 15 (positive and negative, respectively) transistors 20, 22, 32, 34 and 28, 30, 36, 38, and biasing currents 66, 68 having bias voltages 66a, 68a, respectively. As will be apparent to those skilled in the art, the p-channel transistors 20, 28 serve as current sources with cascode devices 22, 30 and the n-channel transistors 32, 36 serve as current sinks with cascode devices 34, 38.

Still referring to FIG. 1, the network of DC biasing circuitry of the prior art single stage amplifier 2 includes p-channel transistors 50, 52 and n-channel transistors 54, 56, 58, 60, 62, 64. Current inputs 66, 68 to these n-channel transistors 54, 56, 58, 60, 62, 64 of the DC biasing circuitry are seen to also appear as bias voltage inputs 66a, 68a to the n-channel cascode devices 34, 38. The current inputs 70, 72 to the p-channel transistors 50, 52 are seen to appear as bias voltage inputs 70a, 72a to the input stage transistors 24, 26 and the p-channel transistors 20, 22, 28, 30.

Continuing still to refer to FIG. 1, the prior art amplifier 2 is seen to also include certain common mode circuitry. The common mode circuitry of the amplifier 2 is comprised of n-channel transistors 82, 80 and p-channel transistors 84, 86, 88, 90. The common mode circuitry also includes an input 92 which serves to accept an externally supplied analog ground reference voltage, typically around the mid-point of the supply voltage range. Another input 94 is the common mode signal which is generated from the amplifier section outputs 14, 15, which generation is typically by means of a resistor divider between the outputs 14, 15 or some switched capacitor divider technique between the outputs 14, 15. In any event, the purpose of the common mode circuitry is to generate a signal 93 which either pushes or pulls the outputs 14, 15 so that the voltages of the outputs 14, 15 are drawn to that of the reference input 92.

Further referring to FIG. 1, the prior art amplifier 2, with differential or common mode circuitry, operates as follows: Generally, when there is a difference in the voltages of the inputs 10, 12, a current imbalance is created in both output stages to either the source or sinking transistors so that more current is being sourced or sinked, depending on the polarity of the imbalance. For example, if the two inputs 10, 12 have identical voltages, the differential pair is split evenly and the circuitry creates a current sink that has the same current as the current source. Then, as one potential comes up and the other potential comes down, a current imbalance results in both output stages such that there's more current being sourced or sinked, depending upon the direction of the imbalance. Along with this general operation of the amplifier and biasing circuitry of the prior art amplifier 2, the common mode circuitry of the amplifier serves to supply a common mode reconstruction or correction voltage signal to the outputs of the amplifier. The illustrated prior art common mode circuitry operates by comparing a DC level generated from the amplifier outputs 14, 15 as input 94, as previously described, to an externally supplied analog ground reference voltage input 92. Based on these two inputs 92, 94 to the common mode circuitry, the common mode circuitry generates a signal 93 which either pushes or pulls the outputs 14, 15 so that the voltages of the outputs 14, 15 are drawn to that of the analog ground reference voltage input 92.

Figure 2:
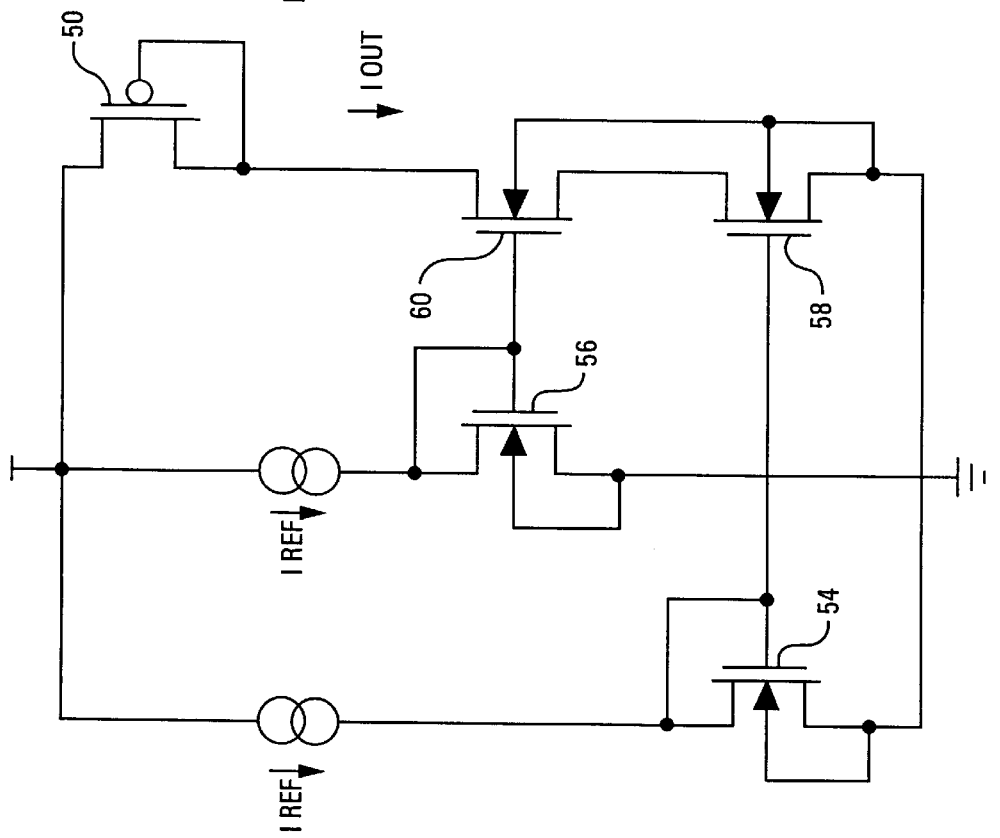
FIG. 2 is a detailed illustration of the DC biasing and current mirroring circuitry of the prior art single stage amplifier of FIG. 1.

Continuing to refer to FIG. 1 now in conjunction with FIG. 2 which more particularly illustrates the DC biasing and current mirroring circuitry of the prior art amplifier 2, the classical manner for sizing this prior art biasing network is to set all of the biasing network n-channel transistors 54, 56, 58, 60, 62, 64 equal in size and to source four times the drain current into transistor 56. This technique creates a $V_{ds}$ across transistor 56 equal to $V_t+1.4\ V_{dsat}$ and since the $V_t$ of transistor 56 and transistor 60 are similar (the $V_t$ of transistor 60 will actually be slightly higher due to body effects), the gate to source drop across transistor 60 will cause transistor 58 to be biased with a $V_{ds}$ of about $1.3\ V_{dsat}$ which will keep transistor 58 in saturation.

Still referring to FIG. 1 in conjunction with FIG. 2, this biasing and current mirroring technique of the prior art is fundamentally problematic because the mirroring transistor 58 in one leg of the current mirror circuitry has a smaller voltage drop $V_{ds}$ than the single transistor 54 in the other leg. This difference in voltage drop between the two legs of the mirroring circuitry causes a mismatch in the current mirror output. The mismatch, though small, can be significant in cases in which the entire device operates at low voltage, and, in those cases, the mismatch can affect the entire operating characteristics of the operational amplifier. As is clear, the mismatch can affect voltages to the common mode circuitry, causing the common mode circuitry to operate less effectively. In addition to differences in voltage drop across transistors in legs of the mirroring circuitry, the transistor $V_{ds}$ and, thus, the current mismatch in the mirroring circuitry of the prior art design, can vary as a result of process, temperature, supply voltage, and reference current changes. Even further, changes in transistor sizes employed in the circuitry can result in significant mismatch problems because there is no easy way of changing transistor sizes in the prior art design and still effecting desired current mirroring. Thus, as is and will become more apparent, the present invention, which substantially reduces the mismatch in a wide variety of circumstances and which includes improved common mode circuitry that takes advantage of the mismatch reduction to improve common mode reconstruction, is a significant improvement in the art, in particular, in low supply voltage applications.

Figure 3:
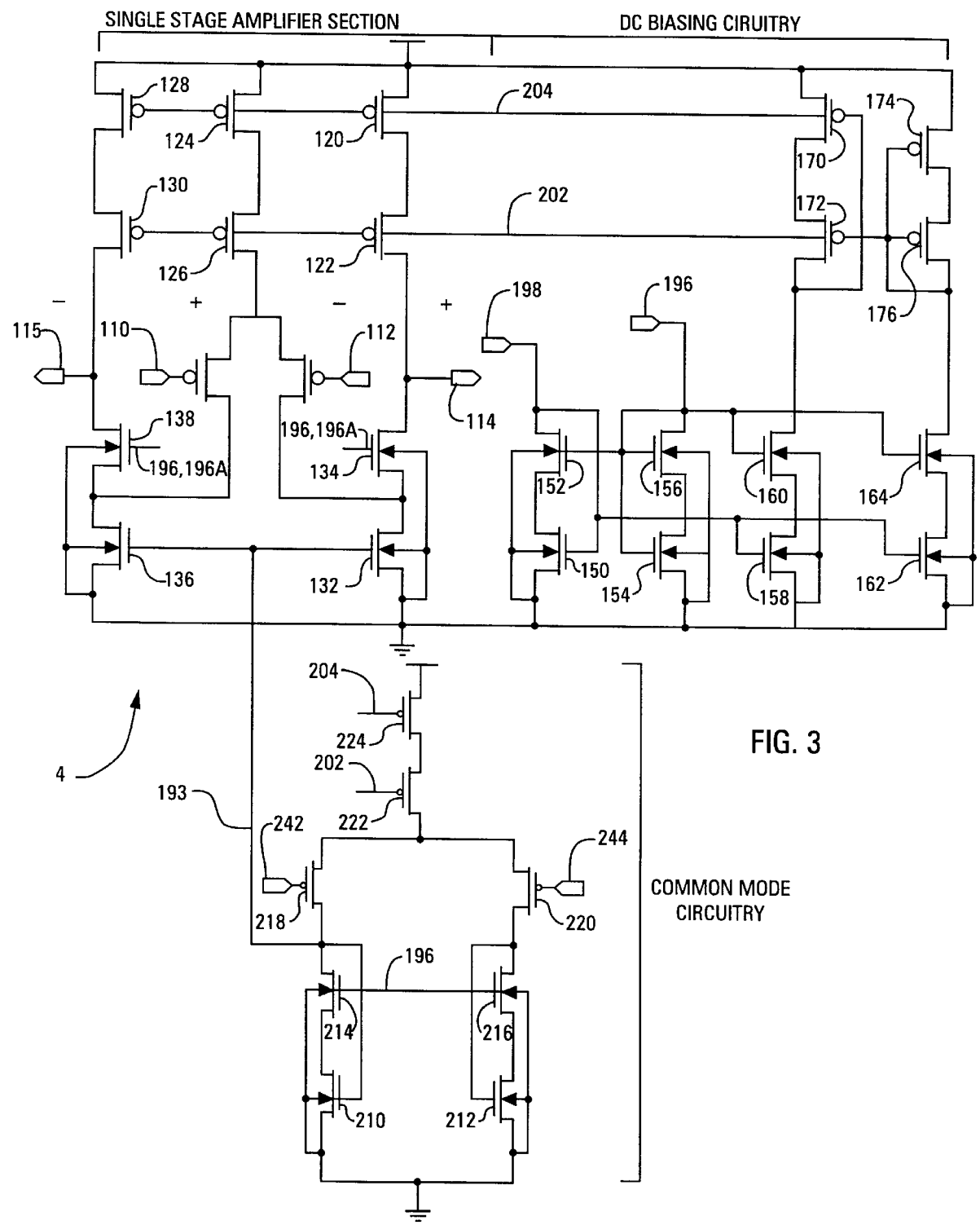
FIG. 3 is a detailed schematic representation of the preferred embodiment of the low voltage fully differential operational amplifier circuit of the present invention, having unique DC biasing and current mirroring schemes and improved common mode reconstruction circuitry.

Now referring to FIG. 3, a preferred embodiment of a single stage, fully differential amplifier 4 of the present invention is illustrated. This amplifier 4 incorporates an improved common mode circuitry technique. This amplifier 4 is also designed to have a minimum voltage drop across the p-channel source transistors 120, 124, 128 and n-channel sink transistors 132, 136, so that the outputs 114, 115 can swing over a greater range. The improved common mode circuitry is especially effective when employed in conjunction with this particular amplifier 4 design. The improved common mode circuitry and the whole of the amplifier 4 design, together with the advantages of each, will be more fully understood through the following descriptions.

Continuing to refer to FIG. 3, in general, the amplifier 4 is organized similar to the prior art amplifier 2 (shown in FIG. 1) in many respects. The present invention includes both a single stage folded cascode amplifier section and a network of DC biasing circuitry. The single stage folded cascode amplifier section has inputs of an inverting input 112 and a non-inverting input 110. The amplifier 4 also has dual-ended non-inverting and inverting outputs 114, 115, respectively. The amplifier section consists of an arrangement of p-channel transistors 120, 122, 124, 126, 128, 130 and an arrangement of n-channel transistors 132, 134, 136, 138.

Still referring to FIG. 3, the DC biasing circuitry of the amplifier 4 is seen to consist of p-channel transistors 170, 172, 174, 176 and n-channel transistors 150, 152, 154, 156, 158, 160, 162, 164. Inputs to the DC biasing circuitry include dual biasing circuitry inputs 196, 198 of identical current. The function of the DC biasing circuitry in this preferred embodiment, and a difference in this amplifier 4 compared to the prior art, is that the DC biasing circuitry of the present amplifier serves to establish bias voltages on the current sources, transistors 120, 124, 128, on the current sinks, transistors 132, 136, and on the cascode devices, transistors 122, 126, 130, 134, 138. In this manner, the current mirroring between sourcing transistors 120, 128 and sinking transistors 132, 136 maintains those transistors in the saturation region for all values of output swing.

Continuing still to refer to FIG. 3, another very significant difference in this amplifier 4 compared to the prior art, is the improved common mode circuitry design employed in this amplifier 4. This common mode circuitry, in particular, is quite effective in taking advantage of the particular biasing concepts employed in the invention. The common mode circuitry yields signal 193 which is a voltage input to gate for n-channel transistors 132, 136 of the amplifier section. The common mode circuitry consists generally of p-channel transistors 218, 220, 222, 224 and n-channel transistors 210, 212, 214, 216. The p-channel transistors 222, 224 are biased by bias voltages 202, 204. Inputs to the common mode circuitry include an externally supplied analog ground reference voltage input 242 to p-channel transistor 218 and a common mode signal input 244 to p-channel transistor 220. As previously described with respect to the prior art, the common mode signal input 244 is generated in a conventional manner, such as by means of a resistor divider between the amplifier 4 outputs 114, 115 or some switched capacitor divider technique between those outputs 114, 115.

Still referring to FIG. 3, the amplifier functions as follows: Generally, when the voltages of the inputs 112, 110 are equal and within the operating range of the amplifier, the current in the output stage, i.e., transistors 120, 122, 132, 134 and 128, 130, 136, 138, is balanced. When the inputs 112, 110 have a differential voltage between them, the output stage has a current imbalance and either pulls high or low. The external load capacitance and feedback serve to give the amplifier 4 compensation and closed loop functionality. One significant aspect of the amplifier 4 which gives the amplifier 4 its favorable characteristics for low supply voltage applications is the particular implementation of the biasing circuitry formed on sinking transistors 132, 136, on sourcing transistors 120, 124, 128, and on cascode transistors 122, 126, 130, 134, 138. This circuitry allows the amplifier 4 to exhibit favorable operating characteristics, even in low supply voltage applications. Through these particular aspects, the amplifier's transistors are maintained in saturation and the use of the cascoded load improves power supply rejection. The common mode circuitry of the amplifier 4 takes particular advantage of these characteristics and provides certain additional favorable aspects to the configuration. In particular, the common mode circuitry accepts a DC level input 244 that is the mid-point of the two outputs 114, 115 of the amplifier 4. The common mode circuitry then compares that DC level input 244 with an analog reference voltage input 242 that is equal to the mid-point level of the supply voltage. If the DC level input 244 and reference voltage input 242 differ, a correction for that difference results in a common mode signal 193 which adjusts the amplified outputs 114, 115 so that the common mode is reconstructed accordingly, i.e., either pushed or pulled to bring the voltages of the amplified outputs 114, 115 very near that of the reference voltage 242. In connection with the entire amplifier, note that the common mode circuitry employs similar biasing schemes to that of the DC biasing circuitry. This serves to set all $V_{ds}$ and $V_{gs}$ potentials equal, thereby maximizing the current matching between the main amplifier and the common mode circuitry. These characteristics of the amplifier 4 can be better understood by considering the particular circuitry and variables involved in a typical application of the amplifier 4.

Figure 4:
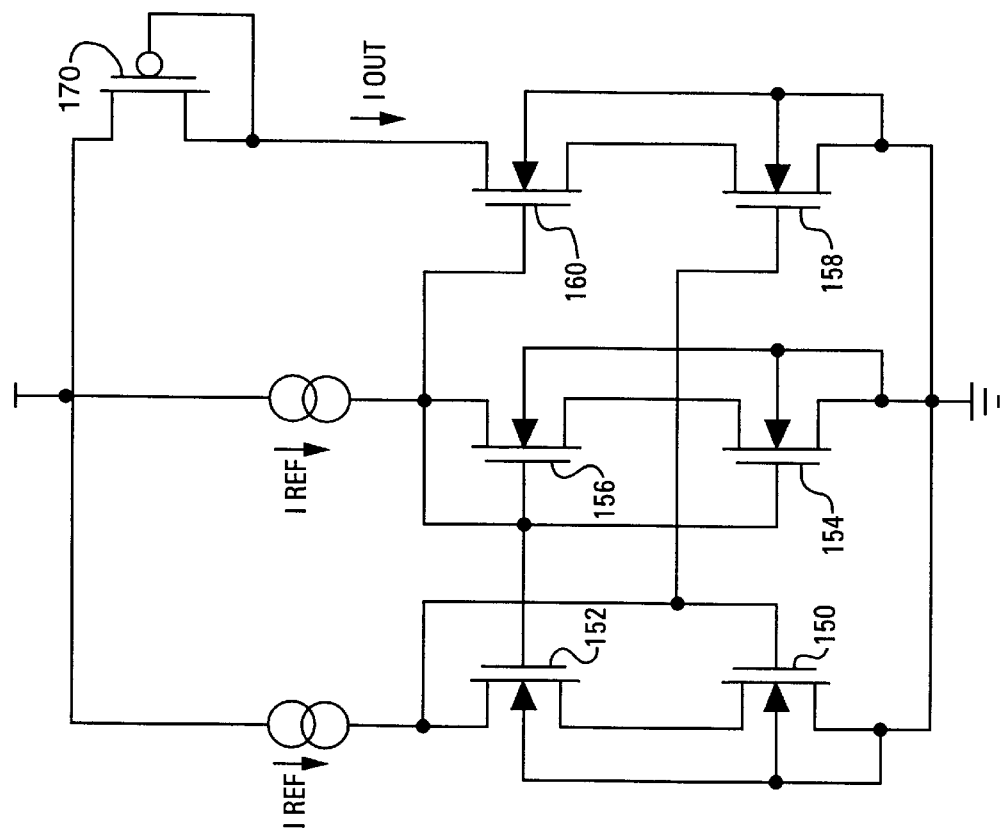
FIG. 4 is a detailed illustration of the DC biasing and current mirroring circuitry of the preferred embodiment of the amplifier circuit of the present invention of FIG. 3.

Referring now to FIG. 4, an illustration of the DC biasing circuitry of the present invention amplifier 4 is shown. This new biasing circuit creates equal $V_{ds}$ voltages across transistors 150, 158 that results in more accurate current matching and less changes for variations in process, temperature, supply voltage, or $I_{ref}$ current. This DC biasing circuit requires that transistors 152, 156, 160 (and also transistor 164 in the amplifier circuit shown in FIG. 3) be sized the same, or as unit multiples, and transistors 150, 158 be sized the same, or as unit multiples. The size of transistor 154 is set so that the desired $V_{ds}$ is derived across transistors 150, 158 (and transistor 162 in FIG. 3) so they remain in saturation (typically 1.3 $V_{dsat}$). As a result of this technique, all of the critical transistors are the same size as or unit multiples of each other (except for transistor 154 which sets the $V_{ds}$ for transistors 150, 158) (and 162 in FIG. 3), and the cascode and sinking devices may be varied in size and still maintain close matching.

Continuing to refer to FIG. 4 and now in conjunction with FIG. 2, in effect, the addition in the present invention of transistor 154 to the DC biasing circuitry serves to set the potential across transistor 150 equal to the potential across transistor 158, to get a true current mirror. The middle stage of the biasing circuitry, i.e., transistors 154, 156, establishes the voltages on the cascode devices, so that the gate to source drop of transistor 152 will drive transistor 150 to an appropriate $V_{ds}$ voltage. Further note that the gate of transistor 150 is, instead of being tied back to drain, tied to the other side of the cascode device so that it picks up the potential, i.e., the additional potential, so that the currents will be mirrored correctly and will have the same drain to source potential.

Still referring to FIG. 4 in conjunction with FIG. 3, in the single stage amplifier section of the amplifier 4, this same biasing technique is employed to bias 196 the n-channel cascode devices 134, 138 and to set up the bias 198 for the n-channel sink devices 132, 136. Note also that, in a similar fashion, currents are mirrored so that bias voltage 204 biases the p-channel devices 120, 124, 128 and bias voltage 202 sets up the bias voltage for the cascode transistors 122, 126, 130.

Referring further to FIG. 4 in conjunction with FIG. 3, a similar biasing technique is also employed in the common mode circuitry. Transistors 222, 224 of the common mode circuitry are biased by voltages 202, 204, respectively, the same voltages which bias the p-channel source and cascode transistors 120, 122, 124, 126, 128, 130 of the amplifier section. Note also that, as with transistor 150 in the DC biasing circuitry, the gates of transistors 210, 212 are tied to the other side of the cascode devices 214, 216, respectively. With this new common mode circuitry design, current mismatch between the common mode circuit and the amplifier core can be substantially reduced, thus, minimizing offset errors in the common mode output voltage 244. The biasing scheme, used in connection with this improved common mode circuitry, minimizes those errors by setting all of the $V_{ds}$ and $V_{gs}$ potentials the same, thereby maximizing the current matching between the main amplifier and the common mode circuitry.

Figure 5:
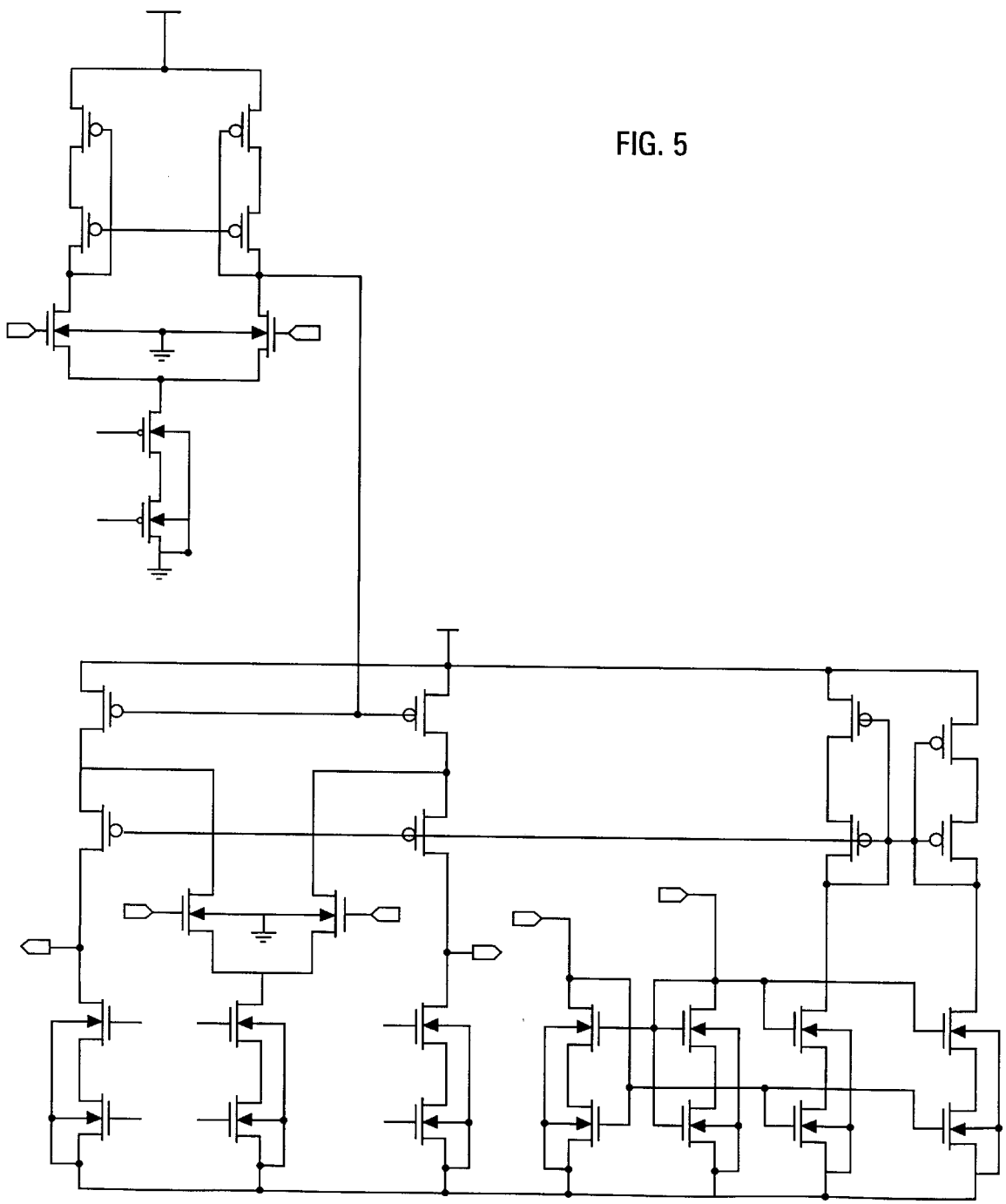
FIG. 5 is a detailed schematic representation of the complementary version single stage amplifier of that shown in FIG. 3.

Next referring to FIG. 5, a complementary, inverted version of the low voltage fully differential operational amplifier with improved common mode circuitry of the present invention is shown. This complementary, inverted version performs in essentially the same manner as the embodiment depicted in FIG. 3, but is the exact complement of the FIG. 3 circuit.

Figure 6:
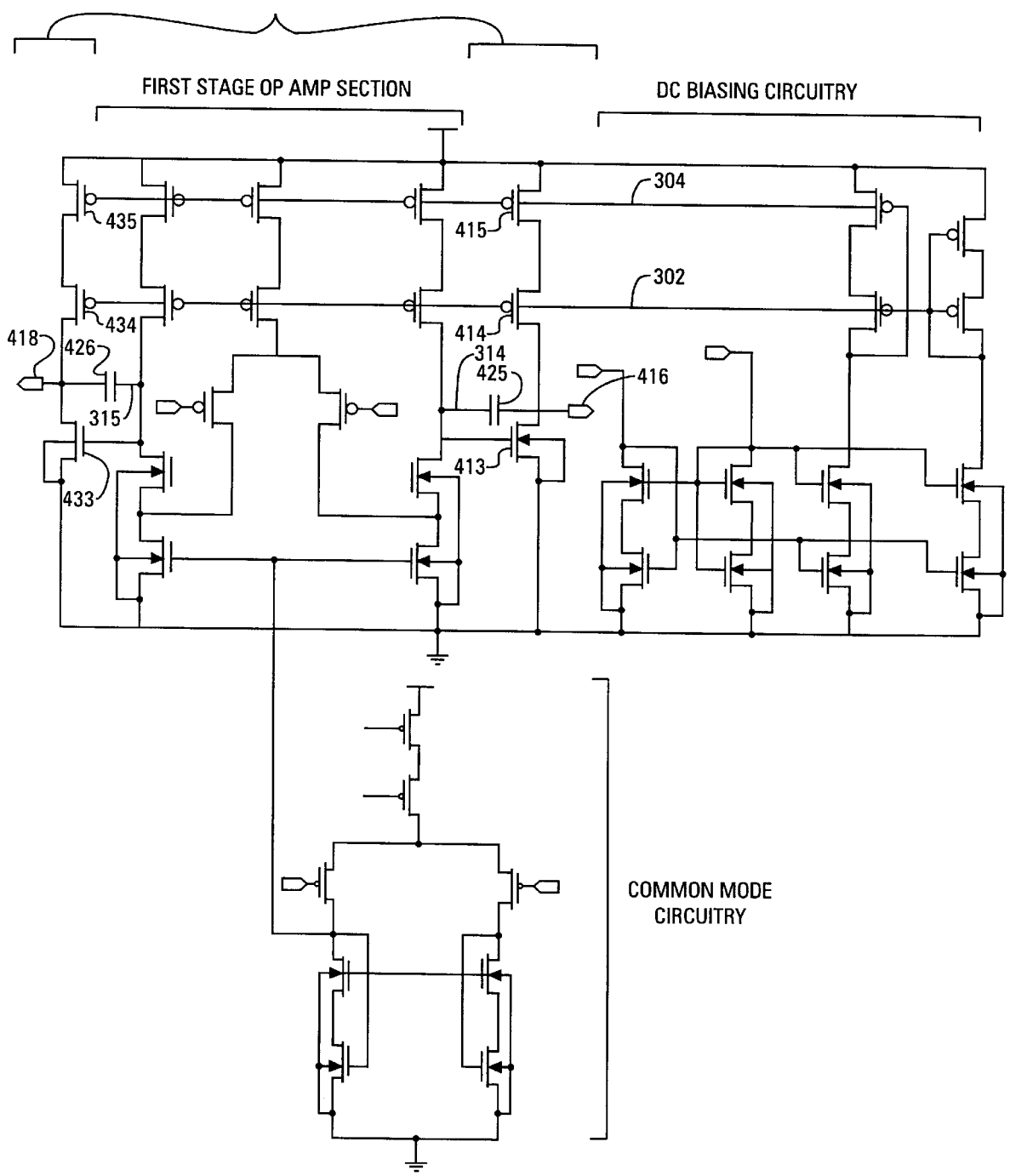
FIG. 6 is a detailed schematic representation of a two stage Class A differential operational amplifier incorporating the DC biasing and current mirroring schemes and the improved common mode reconstruction circuitry of the present invention.

Now referring to FIG. 6, a two stage Class A operation amplifier 6, incorporating the biasing, current mirroring, and common mode reconstruction circuitry techniques of the present invention, is illustrated. This amplifier 6 consists of a single stage amplifier section (like that of the device in FIG. 3), a network of DC biasing circuitry (like that of the device in FIGS. 3 and 4), and improved common mode reconstruction circuitry (like that of the device in FIG. 3). The second stages of the amplifier 6 are Class A output stages. The incorporation of the Class A output stages with the single stage amplifier section thus forms a generic two stage Class A fully differential operational amplifier. In this embodiment, transistors 413, 414, 415 and 433, 434, 435 and capacitors 425 and 426 form the output stages. Transistors 414, 415 and 434, 435 create constant current sources, while transistors 413 and 433 derive the output levels based on their respective gate potentials supplied from the first stage outputs 314, 315. The circuitry sets up current sources which are biased from the same biasing sources 302, 304 as in the single stage amplifier 4 design (FIG. 3). Capacitors 425, 426 are standard Miller compensation capacitors. Transistors 413, 433, in effect, act as "throttles" to modulate the outputs 416, 418. As the gates of the respective transistors 413, 433 go up, they put more drive on the respective transistors to pull the output down, and as the gates of the respective transistors 413, 433 go down, they turn the device off and allow the output to pull up.

Figure 7:
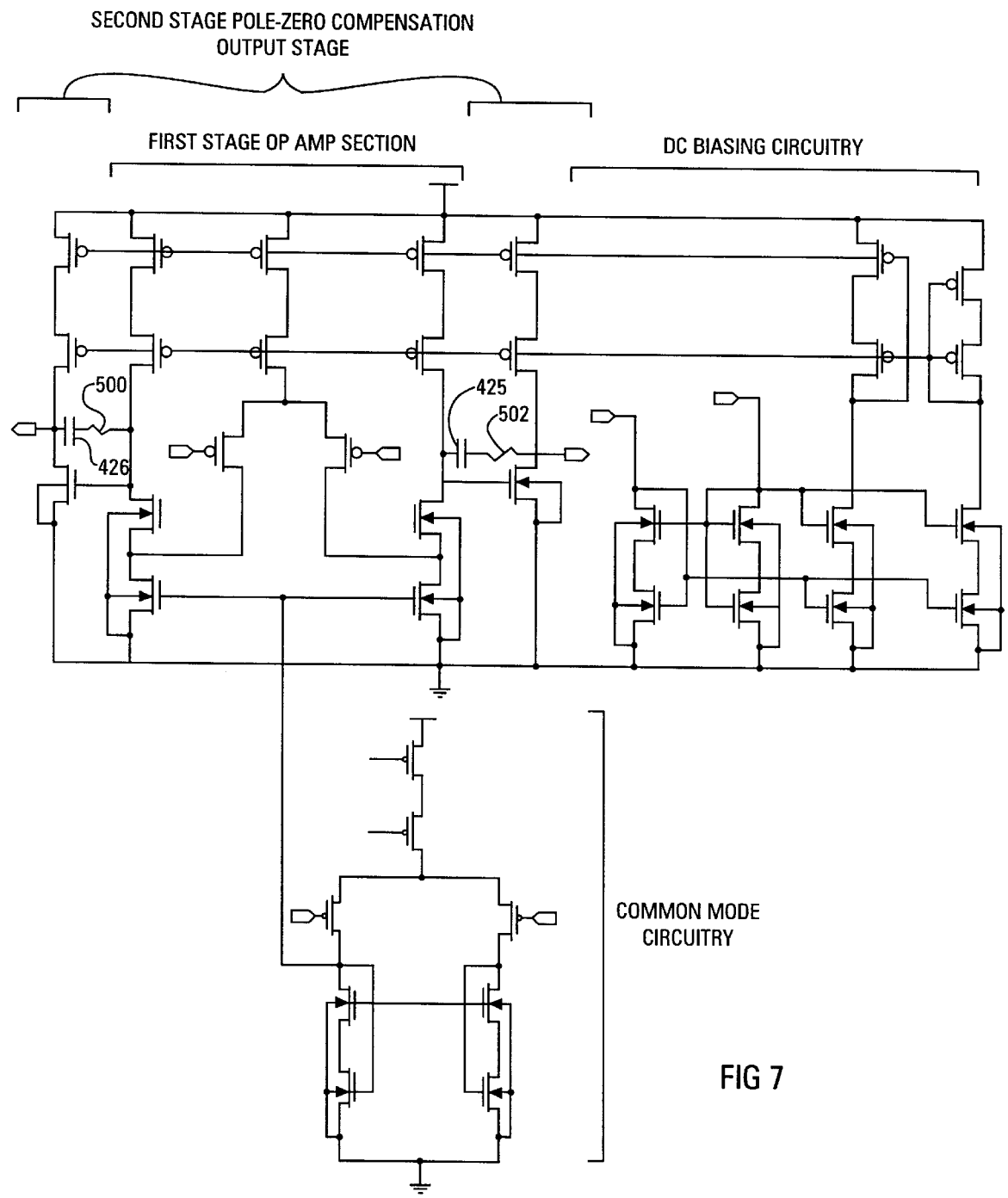
FIG. 7 is a detailed schematic representation of a two stage differential operational amplifier incorporating the DC biasing and current mirroring schemes and the improved common mode reconstruction circuitry of the present invention, and having pole-zero compensation.

Now referring to FIG. 7, those skilled in the art will recognize that numerous variations in the configuration and elements may be possible without departing from the functions of the device and the manner in which it accomplishes those functions. As an example of one alternative design, notwithstanding there are many others and so this example is not intended to be limiting, a pole-zero compensation, rather than the pole-splitting compensation described above, may be employed. This can be accomplished in the two stage amplifier 6 by replacing the capacitors 425, 426 with series resistors 500, 502 and capacitors 425, 426. In other examples, further multiple stage, complementary arrangements, and other modifications, additions, and deletions may be made in the designs without departing from the intended scope of the description of the invention herein. In these and other embodiments based on the same principles described herein, the single stage amplifier is thought to be particularly applicable in higher frequency switched capacitor circuits (e.g., sigma-delta modulators, filters, etc.) and the two stage amplifier is believed to have many diverse applications and to be suitable as an all-purpose operational amplifier.

As is clearly seen, the present invention overcomes the problems presented by the prior art devices. The present invention is believed to be especially effective when configured and employed as described herein, however, those skilled in the art will readily recognize that numerous variations and substitutions may be made in the device and its use and configuration to achieve substantially the same results as achieved by the embodiments and, in particular, the preferred embodiments expressly described herein. Each of those variations is intended to be included in the description herein and forms a part of the present invention. The foregoing detailed description is, thus, to be clearly understood as being given by way of illustration and example only, the spirit and scope of the present invention being limited solely by the appended claims.

What is claimed is:

1. A fully differential operational amplifier, comprising:
    an inverting input;
    a non-inverting input;
    a first output, having a first voltage;
    a second output, having a second voltage;
    a reference voltage input, having a reference voltage;
        first circuitry for amplifying, connected to said inverting input and said non-inverting input to yield said first output and said second output, and including at least one pair of MOS-type transistors for pushing and pulling;
        second circuitry, including at least one pair of MOS-type transistors for pushing and pulling, for common mode reconstruction, each of the MOS-type transistors having an associated $V_{ds}$ that is equal to or a multiple of each $V_{ds}$ of the other MOS-type transistors, said second circuitry receives said reference voltage input and said first output and said second output and pushes or pulls each of said first output and said second output to draw said first voltage and said second voltage substantially near said reference voltage of said reference voltage input.

2. The fully differential operational amplifier of claim 1, wherein said at least one pair of MOS-type transistors of said second circuitry for common mode reconstruction comprises:
    circuitry for receiving an average of said first voltage and said second voltage and
    circuitry for pushing said outputs high when said reference voltage exceeds said average and for pulling said outputs low when said average exceeds said reference voltage.

3. The fully differential operational amplifier of claim 1, wherein said second circuitry for common mode reconstruction includes common mode circuitry.

4. The fully differential operational amplifier of claim 2, further comprising:
    at least one cascode circuit, connected to said first circuitry, for pushing; and
    at least one cascode circuit, connected to said first circuitry, for pulling.

5. The fully differential operational amplifier of claim 4, wherein said DC biasing circuitry establishes bias voltages on said circuit for pulling thereby maintaining said circuit for pulling substantially in saturation.

6. The fully differential operational amplifier of claim 5, wherein said second circuitry for common mode reconstruction includes a common mode circuitry.

7. The differential operational amplifier of claim 6, wherein said common mode circuitry comprises an input of said reference voltage input of about a mid-point of a range of power supply voltage and an input of a common mode output voltage from said amplifier, said inputs each being directed to a gate of a p-channel transistor, each of said p-channel transistors being connected to series connected n-channel transistors, at least two of said n-channel transistors having a common gate, and series connected p-channel transistors connecting between said inputs.

8. The fully differential operational amplifier of claim 2, further including DC biasing circuitry.

9. The fully differential operational amplifier of claim 2, wherein said second circuitry for common mode reconstruction comprises an input of said reference voltage input of about a mid-point of a range of power supply voltage and an input of a difference signal determined as an average of said first voltage and said second voltage, said inputs each being directed to a gate of a p-channel transistor, each of said p-channel transistors being connected to series connected n-channel transistors, each of said n-channel transistors having a common gate, and series connected p-channel transistors connecting between said inputs.

10. The fully differential operational amplifier of claim 9, wherein each of said series connected p-channel transistors are biased by an applied bias voltage and at least one of said series connected n-channel transistors is biased by a different applied bias voltage.

11. The fully differential operational amplifier of claim 10, wherein said circuitry for pushing and pulling includes a circuit for pulling and a circuit for pushing and the amplifier further comprising DC biasing circuitry, said DC biasing circuitry selectively establishes bias voltages on said circuit for pulling, thereby maintaining said circuit for pulling in saturation, and on said circuit for pushing, thereby maintaining said circuit for pushing in saturation for substantially the entire range of voltages of said outputs.

12. The fully differential operational amplifier of claim 11, wherein said at least one of said series connected n-channel transistors are biased by said bias voltages established by said DC biasing circuitry.

13. The fully differential operational amplifier of claim 2, wherein said circuitry for pushing and pulling includes at least one source transistor for pushing and at least one sink transistor for pulling.

14. In a method of DC biasing and common mode reconstructing in a fully differential operational amplifier having common mode circuitry, dual inputs and dual-ended outputs, the improvement wherein said DC biasing includes pushing said output high when a voltage differential between said dual inputs is positive to bring the voltage level of said outputs near a power supply voltage and pulling low when said voltage differential between said dual inputs is negative to bring the voltage level of said outputs near a ground, and wherein said common mode reconstructing includes inputting an externally supplied analog ground reference voltage of about a mid-point of a range of power supply voltage and inputting an average of said outputs from said amplifier and substantially mirroring currents of said common mode circuitry using at least one pair of transistors having a $V_{ds}$ that is common or related as a multiple in order to reconstruct said outputs to account for voltage errors attributable to common mode signals input to said amplifier via said inputs and due to voltage drop attributable thereto within said amplifier, and providing amplifier circuitry having substantially mirrored currents using transistors each with a $V_{ds}$ that is the same or a multiple of the $V_{ds}$ of the transistors of said at least one pair.

15. A method of common mode reconstruction in a differential operational amplifier having dual inputs and dual-ended outputs, said amplifier comprised of sinking transistors and sourcing transistors and corresponding biasing transistors, comprising the steps of:

inputting an externally supplied analog ground reference voltage of about a mid-point of a range of power supply voltage for said amplifier to a gate of a first p-channel transistors;

inputting an average signal being an average of said outputs; from said amplifier to a gate of a second p-channel transistor;

coupling each of said first p-channel transistor and said second p-channel transistor to series connected p-channel transistors; and connecting said first p-channel transistor to series connected n-channel transistors, at least two of said n-channel transistors having a common gate;

connecting said second p-channel transistor to series connected n-channel transistors, each of said n-channel transistors having a common gate;

connecting each of said series connected n-channel transistors to a common ground; and connecting said amplifier at a drain of said first p-channel transistor; wherein currents in said amplifier are substantially mirrored via said method, thereby reconstructing said dual-ended outputs to account for voltage errors attributable to common mode signals input to said amplifier via said inputs and due to voltage drop attributable to said amplifier.

16. The method of claim 15, further comprising the step of connecting said amplifier with DC biasing circuitry.

17. A fully differential operational amplifier, comprising:

an amplifier section including an inverting input, a non-inverting input, a first output, and a second output;

a DC biasing network coupled to the amplifier section and having first, second, third, and fourth cascode arrangements and configured to provide first, second, third, and fourth bias voltages to the amplifier;

a common mode circuit section coupled to the DC biasing network and to the amplifier section, and arranged to receive the first bias voltage, a reference voltage, and a midpoint voltage, the midpoint voltage relative to voltages of the first and second outputs, the common mode circuit section including a fifth cascode arrangement configured to receive a current generated from the reference voltage, and a sixth cascode arrangement configured to receive a current generated from the midpoint voltage, and the fifth cascode arrangement configured to provide a bias voltage to sinking transistors of the amplifier.

18. The amplifier of claim 17, wherein the first bias voltage is applied to gates of cascode transistors in the amplifier, to gates of cascode transistors in the first and second cascode arrangements, and to gates of cascode transistors in the fifth and sixth cascode arrangements.

19. The amplifier of claim 18, wherein the second bias voltage is applied to a gate of a sinking transistor in the cascode arrangement and to a drain of a cascode transistor in the second cascode arrangement.

20. The amplifier of claim 17, wherein the third bias voltage is applied to gates of cascode transistors in the amplifier, and the fourth biasing voltage is applied to gates of sourcing transistors in the amplifier.

21. The amplifier of claim 20, wherein the third and fourth bias voltages are applied to the common mode circuit section.

22. The amplifier of claim 17, wherein gates of sinking transistors in the first, second, third, fourth, fifth, and sixth cascode arrangements are respectively coupled to drains of cascode transistors of the arrangements.

23. The amplifier of claim 17, wherein the drain of the cascode transistor of the fifth cascode arrangement is coupled to gates of the sinking transistors of the amplifier.

24. The amplifier of claim 17, wherein sourcing transistors of the amplifier and transistors of the third and fourth cascode arrangements are p-channel transistors, and transistors of the first, second, fifth and sixth cascode arrangements are n-channel transistors, and the common mode circuit section including first and second p-channel transistors coupled in series and having gates arranged to respectively receive the third and fourth bias voltages, the first transistor coupled to p-channel transistors that are respectively gated by the reference voltage and the midpoint voltage.

25. The amplifier of claim 17, wherein cascode transistors of the first and second cascode arrangements are the same size.

* * * * *